(12) United States Patent
Miyano

(10) Patent No.: US 7,202,692 B2
(45) Date of Patent: Apr. 10, 2007

(54) SEMICONDUCTOR CHIP AND METHOD OF TESTING THE SAME

(75) Inventor: Kazutaka Miyano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/349,979

(22) Filed: Feb. 9, 2006

(65) Prior Publication Data
US 2006/0176070 A1 Aug. 10, 2006

(30) Foreign Application Priority Data
Feb. 9, 2005 (JP) ............................. 2005-032948

(51) Int. Cl.
*G01R 31/26* (2006.01)
*G01R 31/28* (2006.01)
(52) U.S. Cl. .................................. 324/765; 324/158.1
(58) Field of Classification Search ...................... None
See application file for complete search history.

(56) References Cited

U.S. PATENT DOCUMENTS

| | | | | |
|---|---|---|---|---|
| 5,731,945 A | * | 3/1998 | Bertin et al. ................. | 361/111 |
| 5,835,552 A | * | 11/1998 | Kusumoto et al. ............. | 377/24 |
| 6,011,681 A | * | 1/2000 | Ker et al. .................... | 361/111 |
| 6,329,863 B1 | * | 12/2001 | Lee et al. .................... | 327/309 |
| 6,586,266 B1 | * | 7/2003 | Lin ............................. | 438/15 |
| 6,741,471 B2 | * | 5/2004 | Fujii et al. ................... | 361/721 |
| 6,885,212 B2 | * | 4/2005 | Yamamoto et al. ......... | 324/765 |
| 2005/0156616 A1 | * | 7/2005 | Morishita et al. ........... | 324/763 |

FOREIGN PATENT DOCUMENTS

| | | |
|---|---|---|
| JP | 2000-124278 A | 4/2000 |
| JP | 2001-210685 A | 8/2001 |
| JP | 2004-85526 A | 3/2004 |

\* cited by examiner

*Primary Examiner*—Paresh Patel
*Assistant Examiner*—Roberto Velez
(74) *Attorney, Agent, or Firm*—Young & Thompson

(57) ABSTRACT

A semiconductor chip includes a plurality of pads; a plurality of interface circuits connected with the plurality of pads, respectively; an internal circuit connected with the plurality of interface circuits; and a transfer circuit connecting the plurality of interface circuits with each other in response to a test mode signal. One of the plurality of pads is a selected pad when the pad is probed, at least one remaining pad is a non-selected pad, one of the plurality of interface circuits corresponding to the selected pad is a selected interface circuit, and at least one remaining interface circuit is a non-selected interface circuit. The internal circuit is tested by using the selected pad, the selected interface circuit, the transfer circuit, and the non-selected interface circuit without using the non-selected pads.

14 Claims, 8 Drawing Sheets

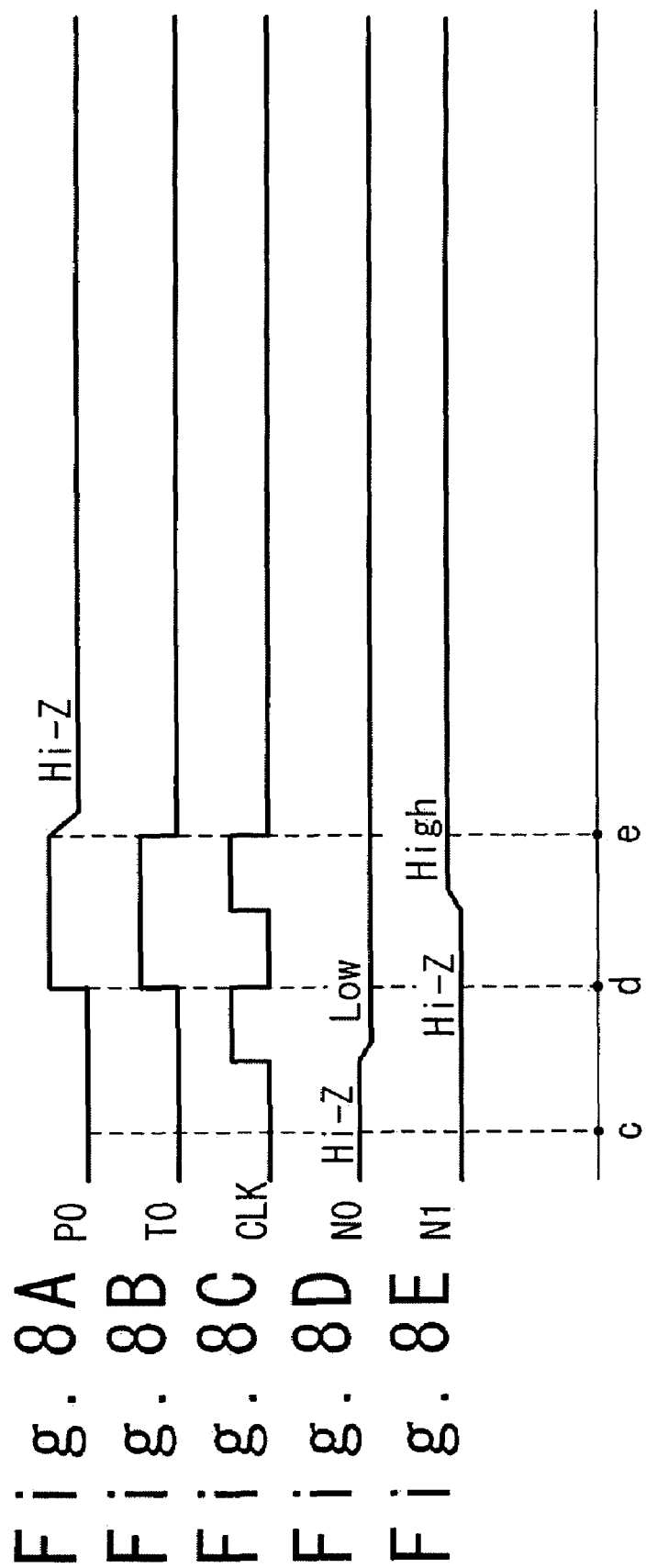

SEMICONDUCTOR CHIP AND METHOD OF TESTING THE SAME

BACKGROUND OF THE INVENTION

1. Field of the Invention

The present invention relates to a semiconductor chip having a pad used for testing an internal circuit.

2. Description of the Related Art

In a process of manufacturing a semiconductor device, a large number of circuit elements are formed on a semiconductor wafer, and a plurality of semiconductor chips having internal circuits are cut out from the semiconductor wafer. The internal circuit includes a memory circuit, a fuse circuit and a CPU. The semiconductor chip is test by a tester having a probe card and a measuring circuit, to test the electric property of the internal circuit.

As the result of the test, the semiconductor chip of good quality is shipped. In the semiconductor chip of the defective semiconductor chips which has a defect in a memory circuit, a redundancy process is carried out to replace a defective memory cell with a redundant memory cell by using a fuse circuit. Thus, the defective semiconductor chip is changed to a good quality semiconductor chip. Defective semiconductor chips are discarded.

A semiconductor chip has a plurality of pads. When the semiconductor chip is tested, the pads on the semiconductor chip are probed with a probe card. In this case, the probed pads are not required to be all of the pads in the semiconductor chip. Preferably, the necessarily minimum number of the pads is desirable. For this reason, when the probed pad is defined as a probing pad P0 and the non-probed pad is defined as a non-probing pad P1, the operation check of the internal circuit for the probing pad P0 is carried out by probing the probing pad P0, and the operation check of the internal circuit for the non-probing pad P1 is carried out by using a test mode and then probing the probing pad P0. This will be described with reference to FIG. 1.

FIG. 1 shows the configuration of a semiconductor chip 101. The semiconductor chip 101 contains an internal data bus 160, a test interface circuit 140, a non-test interface circuit 141, selector circuits 150 and 151 and a test circuit 190 in addition to the probing pad P0 and the non-probing pad P1. Also, an internal circuit 180 of the semiconductor chip 101 includes a memory circuit (not shown), a fuse circuit (not shown) and a CPU (Central Processing Unit) (not shown). The internal circuit is connected to the internal data bus 160. The internal data bus 160 includes a test internal bus and a non-test internal bus. The test internal bus includes an internal input bus N0 and an internal output bus N0', and the non-test internal bus includes an internal input bus N1 and an internal output bus N1'.

The test interface circuit 140 contains an input circuit 110, an input protection resistor 120 and an output circuit 130. The input circuit 110 is connected to the input protection resistor 120 and the selector circuit 150. The input protection resistor 120 is connected to the probing pad P0. The output circuit 130 is connected to the selector circuit 150, the input protection resistor 120 and the probing pad P0. The non-test interface circuit 141 contains an input circuit 111, an input protection resistor 121 and an output circuit 131. The input circuit 111 is connected to the input protection resistor 121 and the selector circuit 151. The input protection resistor 121 is connected to the non-probing pad P1. The output circuit 131 is connected to the selector circuit 151, the input protection resistor 121 and the non-probing pad P1.

A test apparatus 102 includes the probe card and measuring device, as described above. The probing pad P0 is probed with the probe card. For example, the test apparatus 102 checks the memory circuit of the internal circuit 180 for a write operation and a read operation. Also, the test circuit 190 sends a test mode signal T100 indicating a low level to the selector circuits 150 and 151, when the test apparatus 102 carries out the operation check of the internal circuit for the probing pad P0. In this case, the selector circuit 150 connects the input circuit 110 and the internal input bus N0 and connects the output circuit 130 and the internal output bus N0'. The test circuit 190 sends the test mode signal T100 indicating a high level to the selector circuits 150 and 151, when the test apparatus 102 carries out the operation check of the internal circuit for the non-probing pad P1. In this case, the selector circuit 151 connects the input circuit 110 and the internal input bus N1 through the selector circuit 150 and connects the output circuit 130 and the internal output bus N1' through the selector circuit 150. The test apparatus 102 outputs a probe signal such as a clock signal, to check the operation of the internal circuit. At this time, the test apparatus 102 checks the operation of the internal circuit for (A) the probing pad P0 and checks the operation of the internal circuit for (B) the non-probing pad P1. This will be described by using FIG. 1.

The operation check in the (A) case will be described below.

The test apparatus 102, when checking the operation of the internal circuit for the probing pad P0, sends a first probe signal to the probing pad P0. For example, the first probe signal indicates the high level in a first period and indicates the low level in a next period. The first probe signal of the high level includes a write command and a write data as a test data, and the first probe signal of the low level includes a read command.

Also, the test circuit 190 sends the test mode signal T100 of the low level to the selector circuits 150 and 151. Since the test mode signal T100 indicates the low level, the selector circuit 150 connects the input circuit 110 and the internal input bus N0 and connects the output circuit 130 and the internal output bus N0'.

At first, the test apparatus 102 sends the write command including an address to the probing pad P0. The input circuit 110 of the test interface circuit 140 receives the write command sent to the probing pad P0 through the input protection resistor 120 and outputs the write command through the selector circuit 150, the internal input bus N0 and the internal data bus 160 to the memory circuit of the internal circuit 180.

Next, the test apparatus 102 sends the write data to the probing pad P0. The input circuit 110 of the test interface circuit 140 receives the write data sent to the probing pad P0 through the input protection resistor 120 and outputs the write data through the selector circuit 150, the internal input bus N0 and the internal data bus 160 to the memory circuit of the internal circuit 180. The write data is written to the memory cell corresponding to the address included in the write command, among the plurality of memory cells of the memory circuit in the internal circuit 180.

Next, the test apparatus 102 sends the read command including the address to the probing pad P0. The input circuit 110 of the test interface circuit 140 receives the read command sent to the probing pad P0 through the input protection resistor 120 and outputs the read command through the selector circuit 150, the internal input bus N0 and the internal data bus 160 to the memory circuit in the internal circuit 180. At this time, the stored data is read out from the memory cell corresponding to the address included in the read command among the plurality of memory cells of the memory circuit in the internal circuit 180. The read data is sent from the internal circuit 180 through the internal data bus 160, the internal output bus N0' and the selector circuit 150 to the test interface circuit 140. The output circuit 130 of the test interface circuit 140 outputs the read data through the probing pad P0 to the test apparatus 102.

Consequently, the test apparatus 102 compares the write data and the read data as the test result in the first probe signal, and if they are coincident with each other, generates the test result indicating the good quality, and if they are not coincident with each other, generates the test result indicating the bad quality. In this way, according to the conventional semiconductor chip, the test apparatus 102 can check the operation of the internal circuit for the probing pad P0.

The operation check in the (B) case will be described below.

The test apparatus 102, when checking the operation of the internal circuit for the non-probing pad P1, sends a second probe signal to the probing pad P0. For example, the second probe signal indicates the high level in the first period and indicates the low level in the next period. The second probe signal of the high level includes the write command and the write data, and the second probe signal of the low level includes the read command. Also, the test circuit 190 sends a test mode signal T100 of the high level to the selector circuits 150 and 151. Since the test mode signal T100 indicates the high level, the selector circuit 151 connects the input circuit 110 and the internal input bus N1 and connects the output circuit 130 and the internal output bus N1' through the selector circuit 150.

At first, the test apparatus 102 sends the write command including the address to the probing pad P0. The input circuit 110 of the test interface circuit 140 receives the write command sent to the probing pad P0 through the input protection resistor 120 and outputs the write command through the selector circuits 150 and 151, the internal input bus N1 and the internal data bus 160 to the memory circuit of the internal circuit 180.

Next, the test apparatus 102 sends the write data to the probing pad P0, The input circuit 110 of the test interface circuit 140 receives the write data sent to the probing pad P0 through the input protection resistor 120 and outputs the write data through the selector circuits 150 and 151, the internal input bus N1 and the internal data bus 160 to the memory circuit of the internal circuit 180. The write data is written to the memory cell corresponding to the address included in the write command among the plurality of memory cells of the memory circuit in the internal circuit 180.

Next, the test apparatus 102 sends the read command including the address to the probing pad P0. The input circuit 110 of the test interface circuit 140 receives the read command sent to the probing pad P0 through the input protection resistor 120 and outputs the read command through the selector circuits 150 and 151, the internal input bus N1 and the internal data bus 160 to the memory circuit in the internal circuit 180. At this time, the read data is read from the memory cell corresponding to the address included in the read command among the plurality of memory cells of the memory circuit in the internal circuit 180. The read data is sent from the memory circuit in the internal circuit 180 through the internal data bus 160, the internal output bus N1' and the selector circuits 151, 150 to the test interface circuit 140. The output circuit 130 of the test interface circuit 140 outputs the read data through the probing pad P0 to the test apparatus 102.

Consequently, the test apparatus 102 compares the write data and the read data as the test result in the second probe signal, and if they are coincident with each other, generates the test result indicating the good quality, and if they are not coincident with each other, generates the test result indicating the bad quality. In this way, according to the conventional semiconductor chip, the test apparatus 102 can check the operation of the internal circuit for the non-probing pad P1.

However, in the conventional semiconductor chip, although the defect in the test interface circuit 140 can be tested, it is impossible to test a defect in the non-test interface circuit 141. When the test apparatus 102 checks the operation of the internal circuit corresponding to the probing pad P0, if the write data and the read data are coincident with each other, this indicates that the test interface circuit 140 is normal. Thus, it is possible to test the defect in the test interface circuit 140. On the other hand, when the test apparatus 102 checks the operation of the internal circuit for the non-probing pad P1, even if the write data and the read data are coincident with each other, this does not indicate whether or not the non-test interface circuit 141 is normal. Therefore, it is impossible to test the defect in the non-test interface circuit 141.

In conjunction with the above description, semiconductor device is disclosed in Japanese Laid Open Patent Application (JP-P2000-124278A) in which a scribe line having no influence on a chip size is used to improve an integration rate, a small number of pins are used to efficiently test a wafer, and the test time of the wafer is reduced. This semiconductor device is intended to collectively test a plurality of semiconductor chips formed on the semiconductor wafer. A cut region of the semiconductor chip contains a wafer test pad for making the test pins of adjacent semiconductor chips in contact with each other and probing them, a controller for determining whether or not the semiconductor chip connected to the wafer test pad is normal; and a control pad for inputting a control signal to control the controller. The controller carries out a comparison test of an expectation value, for the respective semiconductor chips connected adjacently to the wafer test pad, in accordance with the control signal inputted to the control pad, and judges whether or not the semiconductor chip is normal, in accordance with whether the expectation value is matched or unmatched.

Also, Japanese Laid Open Patent Application (JP-P2004-85526A) describes a semiconductor device, which is used for a system-in-package and attains an output buffer circuit that can drive an output pad with an optimally driving power, in a usual operation mode and a test operation mode. This semiconductor device has first and second output buffers coupled to the output pad. The first output buffer is activated in the usual operation mode, and set to an output high impedance state in the test operation mode, and drives the output pad with a first driving power in accordance with an inner signal on the activation. The second output buffer is activated in the test operation mode, and set to the output high impedance state in the usual operation mode, and drives the output pad with a second driving power greater than the first driving power in accordance with the inner signal at the time of the activation.

Also, Japanese Laid Open Patent Application (JP-P2001-210685A) describes a testing system which can test a semiconductor chip in a short time without using any expensive tester. The testing system carries out an electric test of the semiconductor chip formed on a semiconductor wafer. This is provided with a probe card, a test circuit and a controller. On the probe card, a conductive needle is placed correspondingly to the arrangement of electrode pads in the semiconductor chip, and it is connected to the test circuit. The test circuit is provided in the probe card and tests the semiconductor chip on the basis of a program. The controller rewrites the program in the test circuit and stores the test result outputted from the test circuit.

SUMMARY OF THE INVENTION

In an aspect of the present invention, a semiconductor chip includes a plurality of pads; a plurality of interface circuits connected with the plurality of pads, respectively; an internal circuit connected with the plurality of interface circuits; and a transfer circuit connecting the plurality of interface circuits with each other in response to a test mode signal. One of the plurality of pads is a selected pad when the pad is probed, at least one remaining pad is a non-selected pad, one of the plurality of interface circuits corresponding to the selected pad is a selected interface circuit, and at least one remaining interface circuit is a non-selected interface circuit. The internal circuit is tested by using the selected pad, the selected interface circuit, the transfer circuit, and the non-selected interface circuit without using the non-selected pads.

A portion of the internal circuit associated with the selected pad is tested by using the selected pad and the selected interface circuit, and a portion of the internal circuit associated with the non-selected pad is tested by using the selected pad, the selected interface circuit, the transfer circuit, and the non-selected interface circuit corresponding to the non-selected pad.

Also, each of the plurality of interface circuits may include an output circuit connected with a corresponding one of the plurality of pads and the internal circuit; a protection circuit connected with the corresponding pad and the output circuit; and an input circuit connected with the protection circuit and the internal circuit. The transfer circuit may be connected with a node between the protection circuit and the input circuit in each of the plurality of interface circuits.

In this case, a test data may be supplied to the selected pad and transferred to the internal circuit through the protection circuit and the input circuit in the selected interface circuit, and a response data corresponding to the test data from the internal circuit may be transferred to the selected pad through the output circuit in the selected interface circuit.

In addition, the test data may be transferred from the selected pad to the internal circuit through the protection circuit in the selected interface circuit, the transfer circuit, and the input circuit in the non-selected interface circuit, and the response data may be transferred from the internal circuit to the selected pad through the output circuit, and the protection circuit in the non-selected interface circuit, the transfer circuit, and the protection circuit in the selected interface circuit.

Also, the transfer circuit may include a specific node; and a MOS transistor provided for each of the plurality of interface circuits to connect the specific node and the node between the protection circuit and the input circuit in the interface circuit. The test mode signal may be supplied to the transfer circuit such that the MOS transistor provided for the selected interface circuit is turned off when a portion of the internal circuit associated with the selected interface circuit is tested, and the MOS transistors provided for the selected interface circuit and the non-selected interface circuit are turned on when a portion of the internal circuit associated with the non-selected interface circuit is tested.

Also, the semiconductor chip may further include a latch circuit provided between each of the plurality of interface circuits and the internal circuit to latch the test data and the response data corresponding to the test data.

In another aspect of the present invention, a method of testing a semiconductor chip, is achieved by providing a semiconductor chip which comprises: a plurality of pads, a plurality of interface circuits connected with the plurality of pads, respectively, an internal circuit connected with the plurality of interface circuits, and a transfer circuit selectively connecting the plurality of interface circuits with each other, wherein one of the plurality of pads is a selected pad when the pad is probed, at least one remaining pad is a non-selected pad, one of the plurality of interface circuits corresponding to the selected pad is a selected interface circuit, and at least one remaining interface circuit is a non-selected interface circuit; and by testing the internal circuit by using the selected pad, the selected interface circuit, the transfer circuit, and the non-selected interface circuit without using the non-selected pads.

Here, the testing may be achieved by supplying a test data to the selected pad; by testing a portion of the internal circuit associated with the selected interface circuit with the test data through the selected pad and the selected interface circuit; and by testing a portion of the internal circuit associated with the non-selected interface circuit with the test data through the selected pad, the selected interface circuit, the transfer circuit, and the non-selected interface circuit corresponding to the non-selected pad.

Also, the testing a portion of the internal circuit associated with the selected interface circuit may be achieved by sending a test data from the selected pad to the internal circuit through a protection circuit and an input circuit in the selected interface circuit; by receiving a response data corresponding to the test data transferred from the internal circuit to the selected pad through an output circuit in the selected interface circuit; and by comparing the test data and the response data.

Also, the testing a portion of the internal circuit associated with the non-selected interface circuit may be achieved by sending from the selected pad to the internal circuit through the protection circuit in the selected interface circuit, the transfer circuit, and the input circuit in the non-selected interface circuit; by receiving the response data transferred from the internal circuit to the selected pad through an output circuit, and a protection circuit in the non-selected interface circuit, the transfer circuit, and the protection circuit in the selected interface circuit; and by comparing the test data and the response data.

Also, the transfer circuit may include a specific node; and a MOS transistor provided for each of the plurality of interface circuits to connect the specific node and the interface circuit. The testing a portion of the internal circuit associated with the selected pad may be achieved by turning off the MOS transistor provided for the selected interface circuit to disconnect the selected interface circuit from the non-selected interface circuit when the portion of the internal circuit associated with the selected interface circuit is tested. The testing a portion of the internal circuit associated with the non-selected pad may be achieved by turning of the MOS transistors provided for the selected interface circuit and the non-selected interface circuit to connect the non-selected interface circuit with the selected interface circuit when the portion of the internal circuit associated with the non-selected interface circuit is tested.

The method may be achieved by further latching the test data outputted from the input circuit in the selected interface circuit to supply the test data to the portion of the internal circuit associated with the selected interface circuit; and by latching the response data corresponding to the test data from the interface circuit.

The method may be achieved by further latching the test data outputted from the input circuit in the non-selected interface circuit to supply the test data to the portion of the internal circuit associated with the non-selected interface circuit; and by latching the response data corresponding to the test data from the interface circuit.

BRIEF DESCRIPTION OF THE DRAWINGS

FIGS. 8A to 8E are timing charts showing the operation of the semiconductor chip according to the third embodiment of the present invention.

DESCRIPTION OF THE PREFERRED EMBODIMENTS

Hereinafter, a semiconductor chip of the present invention will be described in detail with reference to the attached drawings.

[First Embodiment]

Figure 1:
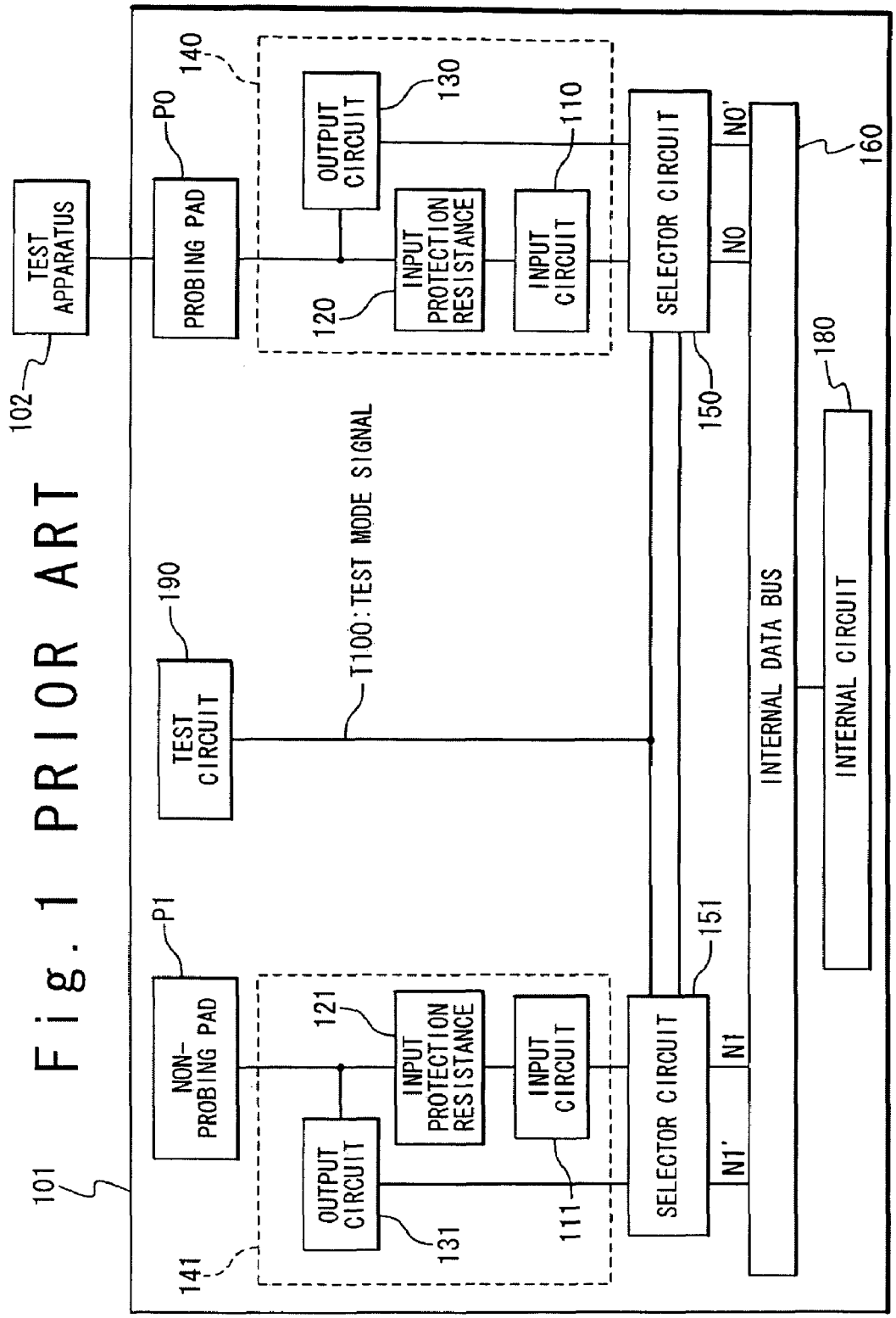
FIG. 1 shows a configuration of a conventional semiconductor chip.
Figure 2:
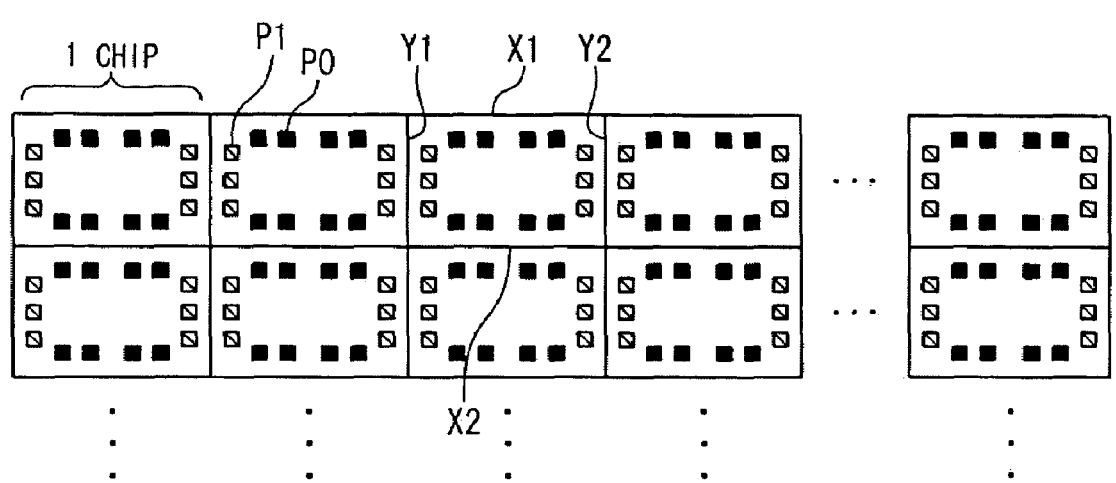
FIG. 2 is a diagram showing a plurality of semiconductor chips formed on a semiconductor wafer according to a first embodiment of the present invention.

FIG. 2 is a diagram showing a plurality of semiconductor chips formed on a semiconductor wafer according to the first embodiment of the present invention. The semiconductor chip according to the first embodiment is quadrangular and has a plurality of pads. The plurality of pads are grouped into a first pad group, a second pad group, a third pad group and a fourth pad group. The first pad group is provided on a side X1 on the semiconductor chip. The second pad group is provided on a side X2 opposite to the side X1 on the semiconductor chip. The third pad group is provided on a side Y1 orthogonal to the sides X1 and X2. The fourth pad group is provided on a side Y2 opposite to the side Y1.

When the semiconductor chip is tested, the pads on the semiconductor chip are probed with a probe card. In this case, all of the pads on the semiconductor chip are not necessarily tested. Preferably, the necessarily minimum number of the pads is tested. Also, in order to test the large number of the semiconductor chips at the same time, probing all of the pads on the four sides on the semiconductor chip is difficult because of the performances of tools. Thus, only the pads existing on two of the four sides on the semiconductor chip are probed. For this reason, when the probed pads are defined as probing pads P0 and the pads that are not probed is defined as non-probing pads P1, the probing pads P0 indicate the pads of the first and second pad groups, and the non-probing pads P1 indicate the pads of the third and fourth pad groups. In this case, the operation check of a portion of the internal circuit for the probing pad P0 is carried out by probing the probing pads P0, and the operation check of a portion of the internal circuit for the non-probing pad P1 is carried out by using a test mode and probing the probing pads P0. This will be described below with reference to FIG. 3.

Figure 3:
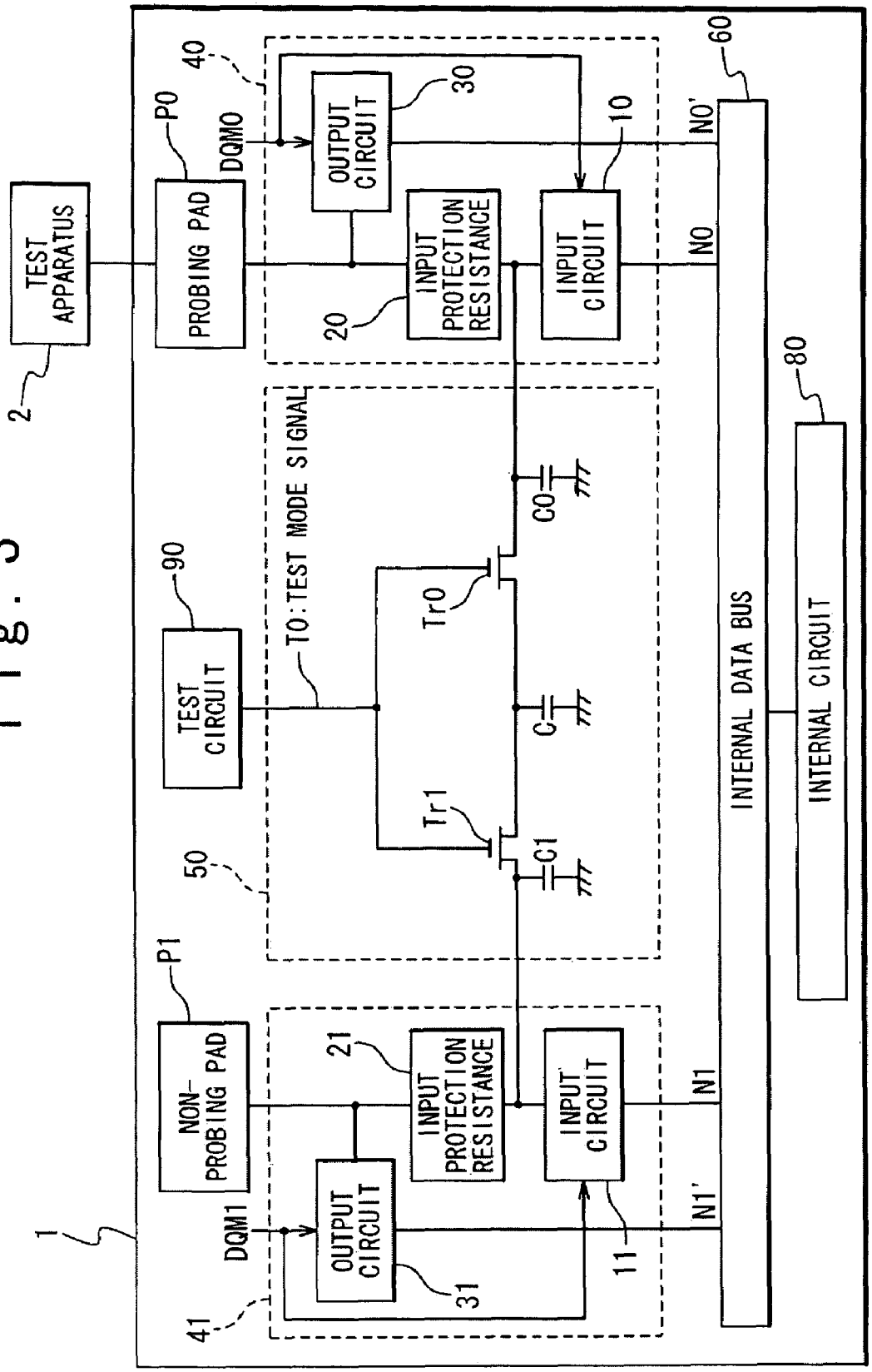
FIG. 3 shows the configuration of the semiconductor chip according to the first embodiment of the present invention.
Figure 4:
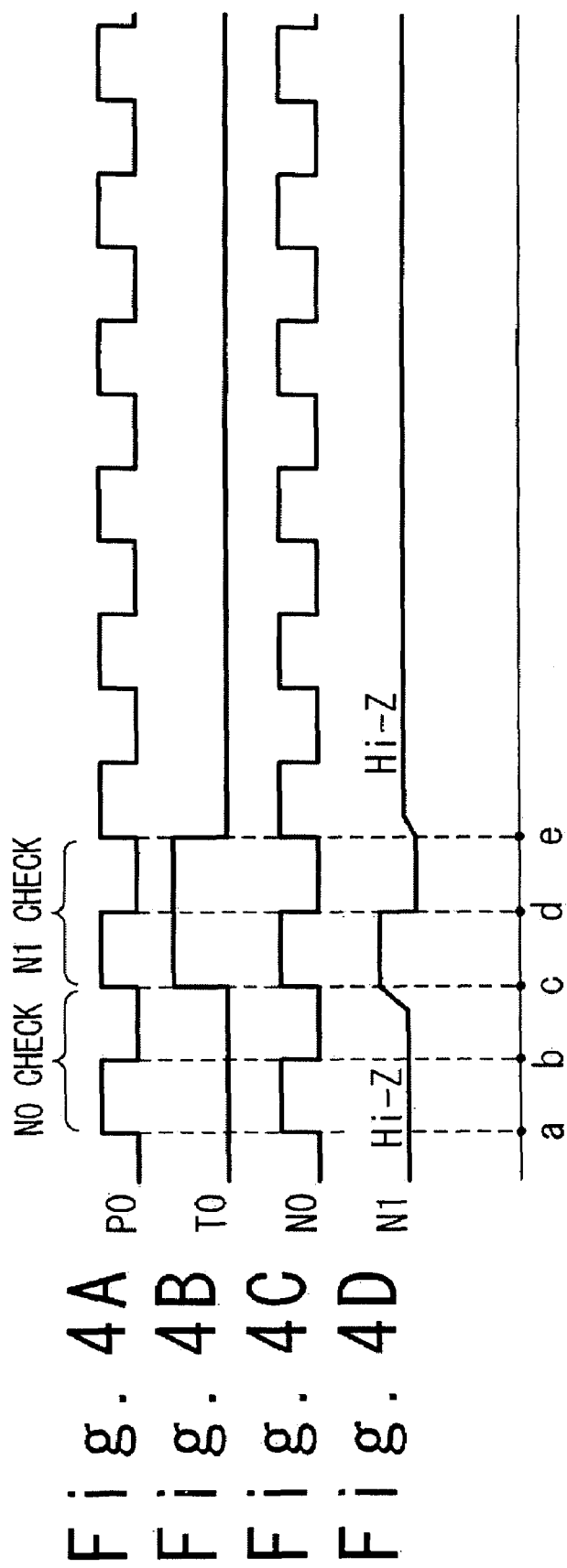
FIGS. 4A to 4D are timing charts showing the operation of the semiconductor chip according to the first embodiment of the present invention.

FIG. 3 shows the configuration of the semiconductor chip 1 according to the first embodiment of the present invention. The semiconductor chip 1 contains an internal circuit 80, an internal data bus 60, a test output circuit 40, a non-test interface circuit 41, a transferring circuit 50 and a test circuit 90. The internal circuit 80 of the semiconductor chip 1 includes a memory circuit (not shown), a fuse circuit (not shown) and a CPU (Central Processing Unit) (not shown). The semiconductor chip 1 is tested by a test apparatus 2. The testing system is composed of this semiconductor chip 1 and the test apparatus 2.

The internal circuit 80 is connected to the internal data bus 60. The internal data bus 60 includes a test internal bus and a non-test internal bus. The test internal bus includes an internal input bus N0 and an internal output bus N0', and the non-test internal bus includes an internal input bus N1 and an internal output bus N1'. The test interface circuit 40 contains an input circuit 10, an input protection circuit 20 and an output circuit 30. The input circuit 10 is connected to the input protection circuit 20 and the internal input bus N0. The input protection circuit 20 is connected to the probing pad P0. The output circuit 30 is connected to the internal output bus N0', the input protection circuit 20 and the probing pad P0. The non-test interface circuit 41 contains an input circuit 11, an input protection circuit 21 and an output circuit 31. The input circuit 11 is connected to the input protection circuit 21 and the internal input bus N1. The input protection circuit 21 is connected to the non-probing pad P1. The output circuit 31 is connected to the internal output bus N1', the input protection circuit 21 and the non-probing pad P1.

The transferring circuit 50 is provided between the test interface circuit 40 and the non-test interface circuit 41. This transferring circuit 50 has transistors Tr0 and Tr1, which are MOS transistors, and capacitors C, C0 and C1. A test mode signal T0 is supplied from the test circuit 90 to gates of the transistors Tr0 and Tr1 to control their active or inactive states. One terminal of the transistor Tr0 is connected to a node between the input circuit 10 and the input protection circuit 20. One terminal of the transistor Tr0 is connected to a node between the input circuit 10 and the input protection circuit 20, and the other terminal of the transistor Tr0 is connected to a node N. One terminal of the transistor Tr1 is connected to the node N and the other terminal of the transistor Tr1 is connected to a node between the input circuit 11 and the input protection circuit 20. The capacitor C0 is connected between the one terminal of the transistor Tr0 and the ground, the capacitor C is connected between the node N and the ground, and the capacitor C1 is connected between the other terminal of the transistor Tr1 and the ground.

The test apparatus 2 includes a probe card and a measuring device; which are not shown, and controls the test circuit 90. For example, the test apparatus 2 controls the test circuit 90 by sending control data or instructions to the test circuit 90 in advance or when the probe card is pushed against the pads. The probing pad P0 is probed with the probe card. For example, the test apparatus 2 checks the memory circuit of the internal circuit 80 for the operation check in a write operation and a read operation.

When the transistors Tr0 and Tr1 are N-channel MOS transistors, the test circuit 90 supplies the test mode signal T0 of a low level to the gates of the transistors Tr0 and Tr1 in the operation check of a portion of the internal circuit 80 for the probing pad P0. In this case, the transistors Tr0 and Tr1 are turned off, and the transferring circuit 50 does not connect the test interface circuit 40 and the non-test interface circuit 41. The test circuit 90 supplies the test mode signal T0 of a high level to the gates of the transistors Tr0 and Tr1, in the operation check of a portion of the internal circuit for the non-probing pad P1. In this case, the transistors Tr0 and Tr1 are turned on, and the transferring circuit 50 connects the test interface circuit 40 and the non-test interface circuit 41.

Also, the test apparatus 2 outputs control signals for controlling input/output of the test interface circuits 40 and 41. When the memory circuit of the internal circuit 80 is DRAM (Dynamic Random Access Memory), DQM0 and DQM1 for controlling typical input/output of the DRAM are exemplified as the control signal. When the control signal DQM0 is outputted to the test interface circuit 40, the test apparatus 2 outputs the control signal DQM1 to the non-test interface circuit 41. The control signal is not limited to the DQM, and if the control signal can individually control the input/output, any control signal can be used.

The test apparatus 2 outputs a probe signal such as a clock signal, to check the operation of the internal circuit 80. At this time, the test apparatus 2 checks the operation of the portion of the internal circuit 80 for (A) the probing pad P0, and checks the operation of the portion of the internal circuit for (B) the non-probing pad P1. This will be described below with reference to FIGS. 3 and 4A to 4D. FIGS. 4A to 4D are timing charts when data is sent from the test apparatus 2 to the probing pad P0.

The operation check in the (A) case will be described below. When checking the operation of the portion of the internal circuit 80 for the probing pad P0, the test apparatus 2 sends the test probe signal corresponding to the control signal DQM0 to the probing pad P0 between timings a–c, c–e, . . . . Between the timings a–c, the test probe signal indicates a high level in a first period between the timings a–b and indicates a low level in a second period between the timings b–c. When of the high level, the test probe signal includes a write command and a write data as a test data DQ, and when of the low level, the test probe signal includes a read command. Also, the test circuit 90 supplies the test mode signal T0 of the low level to the gates of the transistors Tr0 and Tr1 between the timings a–c in response to an external command or a command from the test apparatus 2. Since the test mode signal T0 indicates the low level, the transistors Tr0 and Tr1 are not turned on.

At first, between the timings a–b, the test apparatus 2 sends the write command including an address to the probing pad P0. The input circuit 10 of the test interface circuit 40 receives the write command sent to the probing pad P0 through the input protection circuit 20 in response to the control signal DQM0, and outputs the write command to the memory circuit in the internal circuit 80 through the internal input bus N0 and the internal data bus 60.

Next, between the timings a–b, the test apparatus 2 sends the write data as the test data DQ to the probing pad P0. The input circuit 10 of the test interface circuit 40 receives the write data sent to the probing pad P0 through the input protection circuit 20 in response to the control signal DQM0, and outputs the write data to the memory circuit in the internal circuit 80 through the internal input bus N0 and the internal data bus 60. The write data is written to the memory cell corresponding to the address included in the write command, among the plurality of memory cells of the memory circuit in the internal circuit 80.

Next, between the timings b–c, the test apparatus 2 sends the read command including the address to the probing pad P0. The input circuit 10 of the test interface circuit 40 receives the read command through the probing pad P0 and the input protection circuit 20 in response to the control signal DQM0, and outputs the read command to the memory circuit in the internal circuit 80 through the internal input bus N0 and the internal data bus 60. At this time, as a test response data to the test data DQ, the stored data is read out from the memory cell corresponding to the address included in the read command, among the plurality of memory cells of the memory circuit in the internal circuit 80. The read data is sent from the memory circuit in the internal circuit 80 to the test interface circuit 40 through the internal data bus 60 and the internal output bus N0'. The output circuit 30 of the test interface circuit 40 outputs the read data to the test apparatus 2 through the probing pad P0 in response to the control signal DQM0.

Consequently, the test apparatus 2 compares the write data serving as the test data DQ and the read data serving as the test response data, for the test between the timings a–c. If they are coincident with each other, the test apparatus 2 generates the test result of the good result. On the other hand, if they are not coincident with each other, the test apparatus 2 generates a test result of a bad result. The test interface circuit 40 outputs the write data sent to the probing pad P0 from the test apparatus 2, through the internal input bus N0 and the internal data bus 60 to the memory circuit in the internal circuit 80, and outputs the read data sent through the internal data bus 60 and the internal output bus N0' from the memory circuit in the internal circuit 80, through the probing pad P0 to the test apparatus 2. Thus, when the write data and the read data are coincident with each other, it is indicated that the test interface circuit 40 is normal. In this way, according to the semiconductor chip based on the first embodiment of the present invention, the test apparatus 2 can check the operation of the portion of the internal circuit 80 for the probing pad P0 and can inspect the defect in the test interface circuit 40.

The operation check in the (B) case will be described below. When checking the operation of the portion of the internal circuit for the non-probing pad P1, the test apparatus 2 sends a non-test probe signal corresponding to the control signal DQML to the probing-pad P0 between the timings c–e. Between the timings c–e, the non-test probe signal indicates the high level in the first period between the timings c–d, and indicates the low level in the second period between the timings d–e. The non-test probe signal of the high level includes the write command and the write data as the test data DQ (referred to as a non-test data DQ) for the non-probing pad P1. The non-test probe signal of the low level includes the read command.

Also, the test circuit 90 sends the test mode signal T0 of the high level to the gates of the transistors Tr0 and Tr1 between the timings c–e in accordance with the command from the outside or test apparatus 2. Since the test mode signal T0 indicates the high level, the transistors Tr0 and Tr1 are turned on.

At first, between the timings c–d, the test apparatus 2 sends the write command including the address to the probing pad P0. The input circuit 11 of the non-test interface circuit 41 receives the write command through the probing pad P0 and the input protection circuit 20 of the test interface circuit 40 and the transferring circuit 50 in response to the control signal DQM1, and outputs the write command to the memory circuit in the internal circuit 80 through the internal input bus N1 and the internal data bus 60.

Next, between the timings c–d, the test apparatus 2 sends the write data as the non-test data DQ to the probing pad P0. The input circuit 11 of the non-test interface circuit 41 receives the write data through the probing pad P0, the input protection circuit 20 of the test interface circuit 40 and the transferring circuit 50 in response to the control signal DQM1, and outputs the write data to the memory circuit in the internal circuit 80 through the internal input bus N1 and the internal data bus 60. The write data is written to the memory cell corresponding to the address included in the write command, among the plurality of memory cells of the memory circuit in the internal circuit 80.

Next, between the timings d–e, the test apparatus 2 sends the read command including the address to the probing pad P0. The input circuit 11 of the non-test interface circuit 41 receives the read command through the probing pad P0, the input protection circuit 20 of the test interface circuit 40 and the transferring circuit 50 in response to the control signal DQM1, and outputs the read command to the memory circuit in the internal circuit 80 through the internal input bus N1 and the internal data bus 60. At this time, as the non-test response data to the non-test data DQ, the stored data is read out from the memory cell corresponding to the address included in the read command, among the plurality of memory cells of the memory circuit in the internal circuit 80. The read data is sent from the memory circuit in the internal circuit 80 to the non-test interface circuit 41 through the internal data bus 60 and the internal output bus N1'. The output circuit 31 of the non-test interface circuit 41 outputs the read data to the test apparatus 2 through the input protection circuit 21, the transferring circuit 50, the input protection circuit 20 of the test interface circuit 40 and the probing pad P0 in response to the control signal DQM1.

Consequently, the test apparatus 2 compares the write data serving as the non-test data DQ and the read data serving as the non-test response data, for the test between the timings c–e. If they are coincident with each other, the test apparatus 2 generates a test result indicating the good chip, and if they are not coincident with each other, the test apparatus 2 generates the test result indicating the bad chip. Also, the non-test interface circuit 41 outputs the write data sent from the test apparatus 2 to the probing pad P0 through the internal input bus N1 and the internal data bus 60 to the memory circuit in the internal circuit 80, and outputs the read data sent from the memory circuit in the internal circuit 80 through the internal data bus 60 and the internal output bus N1' through the transferring circuit 50, the test interface circuit 40 and the probing pad P0 to the test apparatus 2. Thus, if the write data and the read data are coincident with each other, it is indicated that the non-test interface circuit 41 is normal. In this way, in the semiconductor chip according to the first embodiment of the present invention, the test apparatus 2 can check the operation of the portion of the internal circuit for the non-probing pad P1 and can inspect the defect in the non-test interface circuit 41.

From the above-mentioned description, in the semiconductor chip according to the first embodiment of the present invention, when the test apparatus 2 checks the operation of the portion of the internal circuit for the probing pad P0, if the write data and the read data are coincident with each other, the test apparatus 2 represents that the test interface circuit 40 is normal. Thus, the test apparatus 2 can check the operation of the portion of the internal circuit 80 for the probing pad P0 and can inspect the defect in the test interface circuit 40 connected to the probing pad P0.

Also, according to the semiconductor chip based on the first embodiment of the present invention, when the test apparatus 2 checks the operation of the portion of the internal circuit for the non-probing pad P1, if the write data and the read data are coincident with each other, this represents that the non-test interface circuit 41 is normal. Thus, the test apparatus 2 can checks the operation of the portion of the internal circuit for the non-probing pad P1 and can inspect the defect in the non-test interface circuit 41 connected to the non-probing pad P1.

Thus, in the semiconductor chip accordance to the first embodiment of the present invention, the test apparatus 2 can check the operation of the portion of the internal circuit for each of the plurality of pads and can inspect the defect in the interface circuit connected to each pad.

[Second Embodiment]

The first embodiment was described under the two systems for the test data DQ and the non-test data DQ. However, in the second embodiment, there are M non-test data DQ (M is an integer of 1 or more), and one probing pad P0 is used to control the (M+1) systems composed of the test data DQ and the M non-test data DQ. The second embodiment will be described with regard to a case where M is 2, namely, the case of the 3 systems will be described. Here, the description overlapping with that of the first embodiment is omitted.

Figure 5:
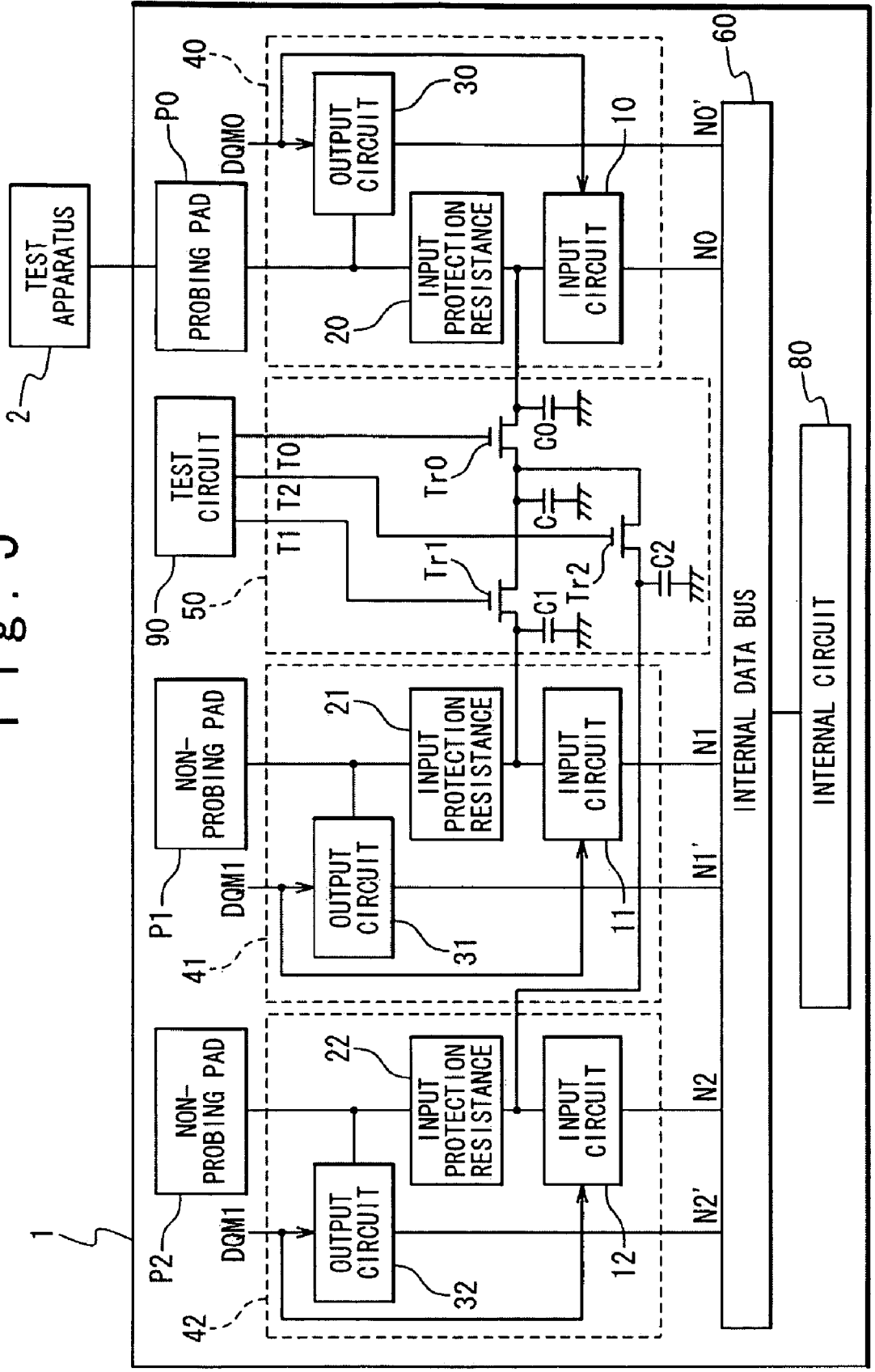
FIG. 5 shows the configuration of the semiconductor chip according to a second embodiment of the present invention.
Figure 6:
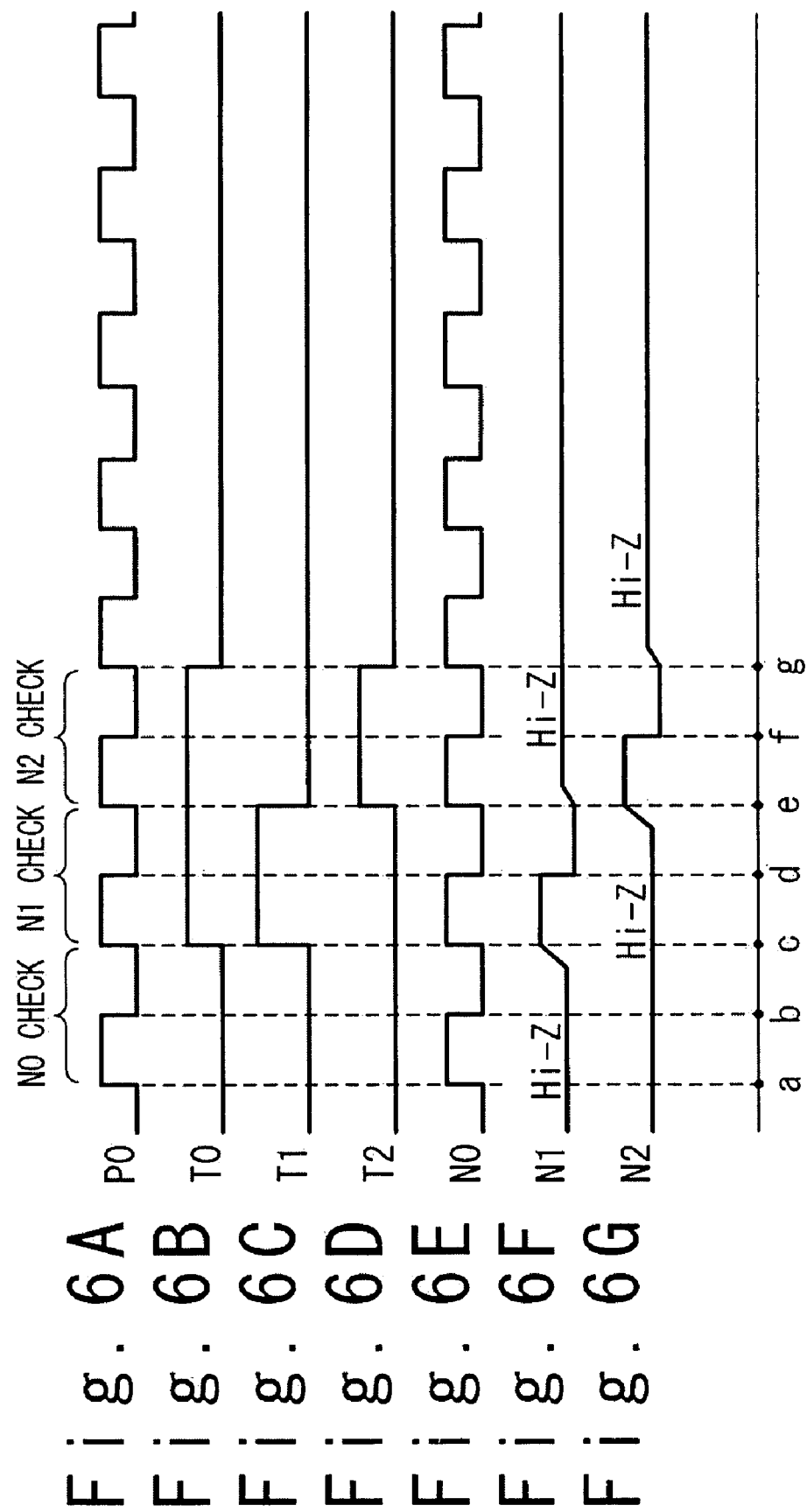
FIGS. 6A to 6G are timing charts showing the operation of the semiconductor chip according to the second embodiment of the present invention.

FIG. 5 shows the configuration of the semiconductor chip 1 according to the second embodiment of the present invention. The foregoing non-probing pad includes the non-probing pad P1 serving as a first non-probing pad and a non-probing pad P2 serving as a second non-probing pad. The foregoing non-test internal bus includes a first non-test internal bus and a second non-test internal bus. The first non-test internal bus includes an internal input bus N1 and an internal output bus N1', and the second non-test internal bus includes an internal input bus N2 and internal output bus N2' The foregoing non-test interface circuit includes a first non-test interface circuit 41 and a non-test interface circuit 42. In this case, the non-test interface circuit 42 has an input circuit 12, an input protection circuit 22 and an output circuit 32. The input circuit 12 is connected to the input protection circuit 22 and the internal input bus N2. The input protection circuit 22 is connected to the non-probing pad P2. The output circuit 32 is connected to the internal output bus N2', the input protection circuit 22 and the non-probing pad P2.

The transferring circuit 50 is provided between the test interface circuit 40 and each of the non-test interface circuits 41 and 42. The transferring circuit 50 has a transistor Tr2, which is a MOS transistor, and a capacitor C2. Test mode signals T0, T1 and T2 are supplied from the test circuit 90 to the gates of the transistors Tr0, Tr1 and Tr2 to indicate their active or inactive states. One terminal of the transistor Tr2 is connected to the node N and the other terminal of the transistor Tr2 is connected to a node between the input circuit 12 and the input protection circuit 22. The capacitor C2 is connected between the node and ground.

The foregoing non-test probe signal includes a first non-test probe signal and a second non-test probe signal. The first and second non-test probe signals will be described later. If the transistors Tr0, Tr1 and Tr2 are the N-channel MOS transistors, the test circuit 90 sends the test mode signals T0, T1 and T2 of to the low level the gates of the transistors Tr0 and Tr1 and Tr2 when the test apparatus 2 carries out the operation check of the portion of the internal circuit for the probing pad P0. In this case, the transistors Tr0, Tr1 and Tr2 are turned off, and the transferring circuit 50 does not connect the test interface circuit 40 and the non-test interface circuits 41 and 42. The test circuit 90 sends the test mode signals T0, T1 of the high level as a first test mode signal to the gates of the transistors Tr0 and Tr1, when the test apparatus 2 carries out the operation check of the portion of the internal circuit for the non-probing pad P1. In this case, the transistors Tr0 and Tr1 are turned on, and the transferring circuit 50 connects the test interface circuit 40 and the non-test interface circuit 41. The test circuit 90 sends the test mode signals T0 and T2 of the high level as a second test mode signal to the gates of the transistors Tr0 and Tr2, when the test apparatus 2 carries out the operation check of the portion of the internal circuit for the non-probing pad P2. In this case, the transistors Tr0 and Tr2 are turned on, and the transferring circuit 50 connects the test interface circuit 40 and the non-test interface circuit 42.

Also, the test apparatus 2 outputs the control signal to the test interface circuits 40, 41 and 42. When outputting the control signal DQM0 to the test interface circuit 40, the test apparatus 2 outputs the control signal DQM1 to the non-test interface circuits 41 and 42. The test apparatus 2 outputs the probe signal such as the clock signal in order to check the operation of the portion of the internal circuit. At this time, the test apparatus 2 checks: (A) the operation of the portion of the internal circuit for the probing pad P0; (B) the operation of the portion of the internal circuit for the non-probing pad P1; and (C) the operation of the portion of the internal circuit for the non-probing pad P2. This will be described below with reference to FIGS. 5 and 6A to 6G. FIGS. 6A to 6G are timing charts when the test apparatus 2 sends a data to the probing pad P0.

Here, since the operation check in the (A) case is identical to that of the first embodiment, its description is omitted.

The operation check in the (B) case will be described below.

When checking the operation of the portion of the internal circuit for the non-probing pad P1, the test apparatus 2 sends the first non-test probe signal corresponding to the control signal DQM1 to the probing pad P0 between timings c–e. Between the timings c–e, the first non-test probe signal indicates the high level in a first period between the timings c–d and indicates the low level in a second period between the timings d–e. The first non-test probe signal of the high level includes the write command and the write data as a first test data DQ (referred to as a first non-test data DQ) for the non-probing pad P1. The first non-test probe signal of the low level includes the read command. Also, the test circuit 90 sends the test mode signals T0 and T1 of the high level as the first test mode signal to the gates of the transistors Tr0 and Tr1 between the timings c–e in accordance with the command from the outside or test apparatus 2. Since the first test mode signals T0 and T1 indicate the high level, the transistors Tr0 and Tr1 are turned on.

At first, between the timings c–d, the test apparatus 2 sends the write command including the address to the probing pad P0. The input circuit 11 of the non-test interface circuit 41 receives the write command sent to the probing pad P0 through the input protection circuit 20 of the test interface circuit 40 and the transferring circuit 50 in response to the control signal DQM1, and outputs the write command to the memory circuit in the internal circuit 80 through the internal input bus N1 and the internal data bus 60.

Next, between the timings c–d, the test apparatus 2 sends the write data that is the first non-test data DQ to the probing pad P0. The input circuit 11 of the non-test interface circuit 41 receives the write data sent to the probing pad P0 through the input protection circuit 20 of the test interface circuit 40 and the transferring circuit 50, in response to the control signal DQM1, and outputs the write data to the memory circuit in the internal circuit 80 through the internal input bus N1 and the internal data bus 60. The write data is written to the memory cell corresponding to the address included in the-write command, among the plurality of memory cells of the memory circuit in the internal circuit 80.

Next, between the timings d–e, the test apparatus 2 sends the read command including the address to the probing pad P0. The input circuit 11 of the non-test interface circuit 41 receives the read command sent to the probing pad P0 through the input protection circuit 20 of the test interface circuit 40 and the transferring circuit 50, in response to the control signal DQM1, and outputs the read command to the memory circuit in the internal circuit 80 through the internal input bus N1 and the internal data bus 60. At this time, as the first non-test response data to the first non-test data DQ, the stored data is read out from the memory cell corresponding to the address included in the read command, among the plurality of memory cells of the memory circuit in the internal circuit 80. The read data is sent from the memory circuit in the internal circuit 80 to the non-test interface circuit 41 through the internal data bus 60 and the internal output bus N1'. The output circuit 31 of the non-test interface circuit 41 outputs the read data to the test apparatus 2 through the input protection circuit 21, the transferring circuit 50, the input protection circuit 20 of the test interface circuit 40 and the probing pad P0, in response to the control signal DQM1.

Consequently, the test apparatus 2 compares the write data serving as the first non-test data DQ and the read data serving as the first non-test response data, for the test between the timings c–e. If they are coincident with each other, this generates the test result indicating the good sample, and if they are not coincident with each other, the test apparatus 2 generates the test result indicating a bad chip. Also, the non-test interface circuit 41 outputs the write data sent to the probing pad P0 from the test apparatus 2 to the memory circuit in the internal circuit 80 through the internal input bus N1 and the internal data bus 60, and outputs the read data sent through the internal data bus 60 and the internal output bus N1' from the memory circuit in the internal circuit 80, through the transferring circuit 50, the test interface circuit 40 and the probing pad P0 to the test apparatus 2. Thus, if the write data and the read data are coincident with each other, the non-test interface circuit 41 represents that it is normal. In this way, according to the semiconductor chip according to the second embodiment of the present invention, the test apparatus 2 can check the operation of the portion of the internal circuit for the non-probing pad P1 and can inspect the defect in the non-test interface circuit 41.

The operation check in the (C) case will be described below. When checking the operation of the portion of the internal circuit for the non-probing pad P2, the test apparatus 2 sends the second non-test probe signal corresponding to the control signal DQM1 to the probing pad P0 between timings e–g. Between the timings e–g, the second non-test probe signal indicates the high level in a first period between the timings e–f and indicates the low level in a second period between the timings f–g. The second non-test probe signal of the high level includes the write command and the write data as a second test data DQ (referred to as a second non-test data DQ) for the non-probing pad P2. The second non-test probe signal of the low level includes the read command.

Also, the test circuit 90 sends the test mode signals T0 and T2 of the high level as the second test mode signal to the gates of the transistors Tr0 and Tr2 between the timings e–g in accordance with the command from the outside or test apparatus 2. Since the second test mode signals T0 and T2 indicate the high level, the transistors Tr0 and Tr2 are turned on.

At first, between the timings e–f, the test apparatus 2 sends the write command including the address to the probing pad P0. The input circuit 12 of the non-test interface circuit 42 receives the write command sent to the probing pad P0 through the input protection circuit 20 of the test interface circuit 40 and the transferring circuit 50, in response to the control signal DQM1, and outputs the write command to the memory circuit in the internal circuit 80 through the internal input bus N2 and the internal data bus 60.

Next, between the timings e–f, the test apparatus 2 sends the write data that is the second non-test data DQ to the probing pad P0. The input circuit 12 of the non-test interface circuit 42 receives the write data sent to the probing pad P0 through the input protection circuit 20 of the test interface circuit 40 and the transferring circuit 50, in response to the control signal DQM1, and outputs the write data to the memory circuit in the internal circuit 80 through the internal input bus N2 and the internal data bus 60. The write data is written to the memory cell corresponding to the address included in the write command, among the plurality of memory cells of the memory circuit in the internal circuit 80.

Next, between the timings f–g, the test apparatus 2 sends the read command including the address to the probing pad P0. The input circuit 12 of the non-test interface circuit 42 receives the read command sent to the probing pad P0 through the input protection circuit 20 of the test interface circuit 40 and the transferring circuit 50, in response to the control signal DQM1, and outputs the read command to the memory circuit in the internal circuit 80 through the internal input bus N2 and the internal data bus 60. At this time, as the second non-test response data to the second non-test data DQ, the stored data is read from the memory cell corresponding to the address included in the read command, among the plurality of memory cells of the memory circuit in the internal circuit 80. The read data is sent from the memory circuit in the internal circuit 80 to the non-test interface circuit 42 through the internal data bus 60 and the internal output bus N2'. The output circuit 32 of the non-test interface circuit 42 outputs the read data to the test apparatus 2 through the input protection circuit 22, the transferring circuit 50, the input protection circuit 20 of the test interface circuit 40 and the probing pad P0, in response to the control signal DQM1.

Consequently, the test apparatus 2 compares the write data serving as the second non-test data DQ and the read data serving as the second non-test response data, for the test between the timings e–g. If they are coincident with each other, the test apparatus 2 generates the test result indicating a good chip, and if they are not coincident with each other, the test apparatus 2 generates the test result indicating a bad chip. Also, the non-test interface circuit 42 outputs the write data sent to the probing pad P0 from the test apparatus 2, through the internal input bus N2 and the internal data bus 60 to the memory circuit in the internal circuit 80, and outputs the read data sent through the internal data bus 60 and the internal output bus N2' from the memory circuit in the internal circuit 80, through the transferring circuit 50, the test interface circuit 40 and the probing pad P0 to the test apparatus 2. Thus, if the write data and the read data are coincident with each other, the non-test interface circuit 42 represents that it is normal. In this way, according to the semiconductor chip based on the second embodiment of the present invention, the test apparatus 2 can check the operation of the portion of the internal circuit for the non-probing pad P2 and can inspect the defect in the non-test interface circuit 42.

From the above-mentioned description, according to the semiconductor chip in the second embodiment, in addition to the effect of the first embodiment, one probing pad P0 can be used to control the (M+1) systems composed of the test data DQ and the M non-test data DQ. Thus, according to the semiconductor chip of the present invention, the number of the times when the test apparatus 2 probes the pads can be reduced over the first embodiment.

[Third Embodiment]

In the first embodiment, the test interface circuit 40 can take them in serial between the timings c–e for the operation check in the (B) case, although taking the test data DQ and the non-test data DQ through one probing pad P0 at a same time. In the third embodiment, a case of M=1, namely, a case of the two systems will be described, and the description overlapping with that in the first and second embodiments is omitted.

Figure 7:
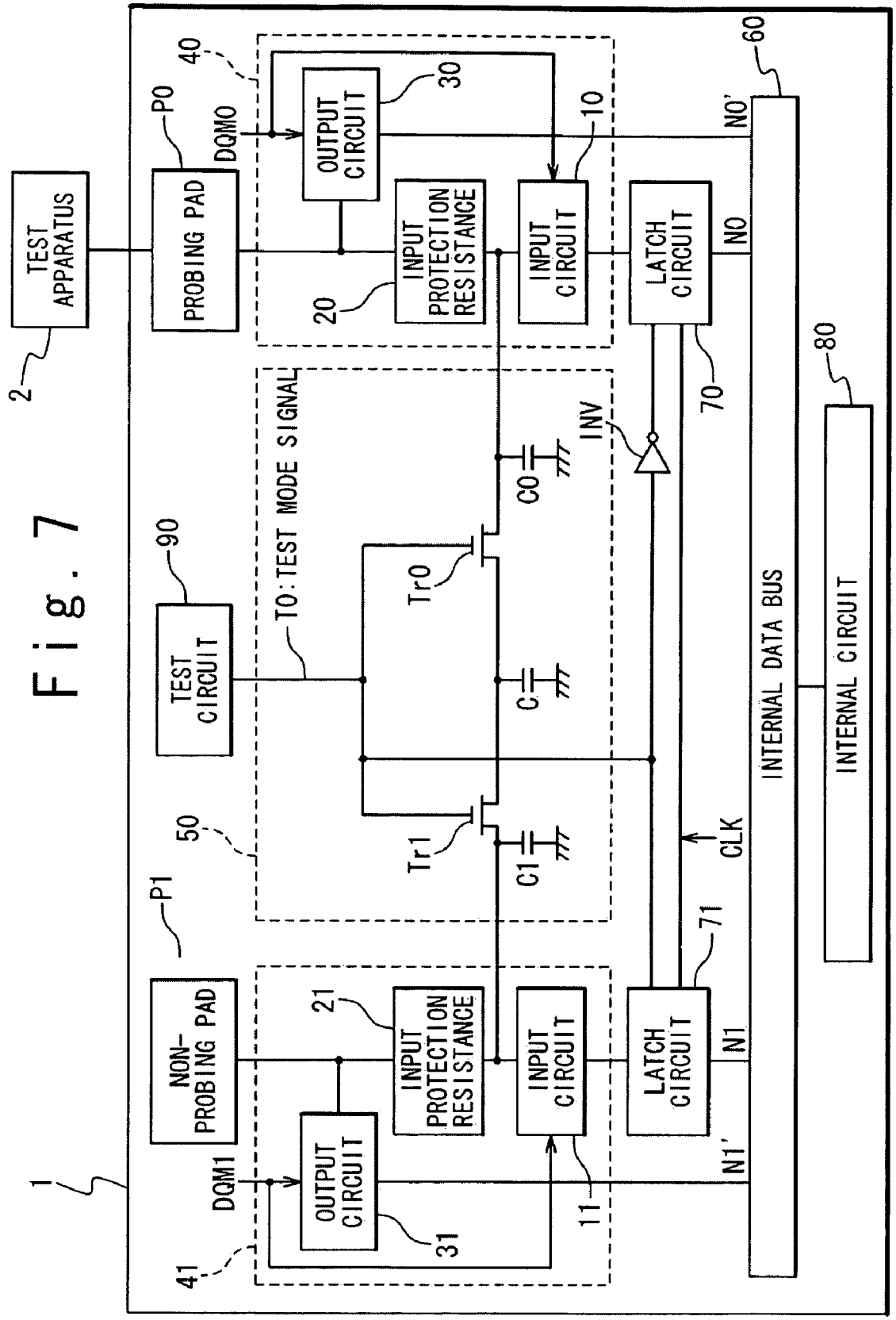
FIG. 7 shows the configuration of the semiconductor chip according to s third embodiment of the present invention.

FIG. 7 shows the configuration of the semiconductor chip 1 according to the third embodiment of the present invention. The semiconductor chip 1 contains a test latch circuit 70, a non-test latch circuit 71 and an inverter INV. The test latch circuit 70 is provided between the test interface circuit 40 and the test internal bus and connected to the input circuit 10 of the test interface circuit 40 and the internal input bus N0. The non-test latch circuit 71 is provided between the non-test interface circuit 41 and the non-test internal bus and connected to the input circuit 11 of the non-test interface circuit 41 and the internal input bus N1. The test apparatus 2 periodically outputs the clock signal to the test latch circuit 70 and the non-test latch circuit 71.

If the transistors Tr0 and Tr1 are the N-channel MOS transistors, the test circuit 90 sends the test mode signal T0 of the low level to the gates of the transistors Tr0 and Tr1 and the non-test latch circuit 71, when the test apparatus 2 carries out the operation check of the portion of the internal circuit 80 for the probing pad P0. Simultaneously, the test circuit 90 sends the test mode signal T0 of the low level through the inverter INV to the test latch circuit 70.

The test circuit 90 sends the test mode signal T0 of the high level to the gates of the transistors Tr0 and Tr1 and the non-test latch circuit 71, when the test apparatus 2 carries out the operation check of the portion of the internal circuit for the non-probing pad P1. Simultaneously, the test circuit 90 sends the test mode signal T0 of the high level through the inverter INV to the test latch circuit 70.

Here, the operation check in the (B) case is described by using FIGS. 7 and 8A to 8E. FIGS. 8A to 8E are timing charts when the data is sent from the test interface circuit 40 to the probing pad P0.

When checking the operation of the portion of the internal circuit for the probing pad P0, the test apparatus 2 sends the test probe signal corresponding to the control signal DQM0 to the probing pad P0 between the timings c–d. The test probe signal includes the write command, the write data serving as the test data DQ, and the read command, as mentioned above. Also, the test circuit 90 sends the test mode signal T0 of the low level to the gates of the transistors Tr0 and Tr1 between the timings c–d, in accordance with the command from the outside or test apparatus 2. Since the test mode signal T0 indicates the low level, the transistors Tr0 and Tr1 are not turned on.

Between the timings c–d, the test apparatus 2 sends the write data serving as the test data DQ to the probing pad P0. The input circuit 10 of the test interface circuit 40 receives the write data sent to the probing pad P0 through the input protection circuit 20, in response to the control signal DQM0, and outputs the write data to the test latch circuit 70. The test latch circuit 70 latches the write data from the input circuit 10 and outputs the write data to the memory circuit in the internal circuit 80 through the internal input bus N0 and the internal data bus 60 in response to a clock signal CLK. As the test response data to the test data DQ, when the read data for the write data is read from the memory circuit in the internal circuit 80, it is sent to the test interface circuit 40 through the internal data bus 60 and the internal output bus N0'. The output circuit 30 of the test interface circuit 40 outputs the read data to the test apparatus 2 through the probing pad P0 in response to the control signal DQM0.

When checking the operation of the portion of the internal circuit for the non-probing pad P1, the test apparatus 2 sends the non-test probe signal corresponding to the control signal DQM1 to the probing pad P0 between the timings d–e. The non-test probe signal includes the write command, the write data serving as the test data DQ (referred to as the non-test data DQ) for the non-probing pad P1, and the read command, as mentioned above. Also, the test circuit 90 sends the test mode signal T0 of the high level to the gates of the transistors Tr0 and Tr1 between the timings d–e, in accordance with the command from the outside or test apparatus 2. Since the test mode signal T0 indicates the high level, the transistors Tr0 and Tr1 are turned on.

Between the timings d–e, the test apparatus 2 sends the write data serving as the non-test data DQ to the probing pad P0. The input circuit 11 of the non-test interface circuit 41 receives the write data sent to the probing pad P0 through the input protection circuit 20 of the test interface circuit 40 and the transferring circuit 50, in response to the control signal DQM1, and outputs the write data to the non-test latch circuit 71. The non-test latch circuit 71 latches the write data from the input circuit 11 and outputs the write data to the memory circuit in the internal circuit 80 through the internal input bus N1 and the internal data bus 60 in response to the clock signal CLK. As the non-test response data to the non-test data DQ, when the stored data is read out from the memory circuit in the internal circuit 80, it is sent to the non-test interface circuit 41 through the internal data bus 60 and the internal output bus N1'. The output circuit 31 of the non-test interface circuit 41 outputs the read data to the probing pad P0 through the input protection circuit 21, the transferring circuit 50, the input protection circuit 20 of the test interface circuit 40 and the probing pad P0 in response to the control signal DQM1.

Consequently, the test apparatus 2 compares the write data serving as the test data DQ and the read data serving as the test response data, for the test between the timings c–d. If they are coincident with each other, the test apparatus 2 generates the test result indicating the good sample, and if they are not coincident with each other, the test apparatus 2 generates the test result indicating the bad sample. The test apparatus 2 compares the write data serving as the non-test data DQ and the read data serving as the non-test response data, for the test between the timings d–e. If they are coincident with each other, the test apparatus 2 generates the test result indicating the good sample, and if they are not coincident with each other, the test apparatus 2 generates the test result indicating the bad sample. In this way, in the semiconductor chip according to the third embodiment of the present invention, one probing pad P0 can be used to capture the test data DQ and the non-test data DQ in serial.

From the above-mentioned description, according to the semiconductor chip of the present invention, in addition to the effects of the first and second embodiments, one probing pad P0 can be used to take the test data DQ and the non-test data DQ in serial. Thus, according to the semiconductor chip of the present invention, the test time when the test apparatus 2 tests the semiconductor chip can be reduced over the first and second embodiments.

As mentioned above, in the semiconductor chip of the present invention, the operation of the portion of the internal circuit can be checked for each of the plurality of pads, and the defect in the interface circuit connected to each of the pads can be tested.

What is claimed is:

1. A semiconductor chip comprising:
   a plurality of pads;
   a plurality of interface circuits connected with said plurality of pads, respectively, each of said plurality of interface circuits comprising a protection circuit connected to a respective one of said plurality of pads and an input circuit connected to said protection circuit;
   an internal circuit connected to the respective said input circuit of each of said plurality of interface circuits; and
   a transfer circuit connecting said plurality of interface circuits with each other in response to a test mode signal, said transfer circuit being connected to a first node between said protection circuit and said input circuit of a first one of said plurality of interface circuits and to a second node between said protection circuit and said input circuit of a second one of said plurality of interface circuits,
   wherein one of said plurality of pads is a selected pad when said pad is probed, and at least one remaining pad is a non-selected pad,
   one of said plurality of interface circuits corresponding to said selected pad is a selected interface circuit, and at least one remaining interface circuit is a non-selected interface circuit, and
   said internal circuit is tested by using said selected pad, said selected interface circuit, said transfer circuit, and said non-selected interface circuit without using said non-selected pad.

2. The semiconductor chip according to claim 1, wherein a portion of said internal circuit associated with said selected pad is tested by using said selected pad and said selected interface circuit, and
   a portion of said internal circuit associated with said non-selected pad is tested by using said selected pad, said selected interface circuit, said transfer circuit, and said non-selected interface circuit corresponding to said non-selected pad.

3. The semiconductor chip according to claim 1, wherein each of said plurality of interface circuits further comprises an output circuit connected with a corresponding one of said plurality of pads and said internal circuit, wherein said protection circuit is connected with said output circuit.

4. The semiconductor chip according to claim 3, wherein a test data is supplied to said selected pad and transferred to said internal circuit through said protection circuit and said input circuit in said selected interface circuit, and a response data corresponding to said test data from said internal circuit is transferred to said selected pad through said output circuit in said selected interface circuit.

5. The semiconductor chip according to claim 4, wherein said test data is transferred from said selected pad to said internal circuit through said protection circuit in said selected interface circuit, said transfer circuit, and said input circuit in said non-selected interface circuit, and said response data is transferred from said internal circuit to said selected pad through said output circuit, and said protection circuit in said non-selected interface circuit, said transfer circuit, and said protection circuit in said selected interface circuit.

6. The semiconductor chip according to claim 5, further comprising:

a latch circuit provided between each of said plurality of interface circuits and said internal circuit to latch said test data and said response data corresponding to said test data.

7. The semiconductor chip according to claim 3, wherein said transfer circuit comprises:

a specific node; and a MOS transistor provided for each of said plurality of interface circuits to connect said specific node and a respective one of said circuit first and second nodes, and said test mode signal is supplied to said transfer circuit such that said MOS transistor provided for said selected interface circuit is turned off when a portion of said internal circuit associated with said selected interface circuit is tested, and said MOS transistors provided for said selected interface circuit and said non-selected interface circuit are turned on when a portion of said internal circuit associated with said non-selected interface circuit is tested.

8. A method of testing a semiconductor chip, comprising:

providing a semiconductor chip which comprises:

a plurality of pads, a plurality of interface circuits connected with said plurality of pads, respectively, each of said plurality of interface circuits comprising a protection circuit connected to a respective one of said plurality of pads and an input circuit connected to said protection circuit, an internal circuit connected to the respective said input circuit of each of said plurality of interface circuits, and a transfer circuit selectively connecting said plurality of interface circuits with each other, said transfer circuit being connected to a first node between said protection circuit and said input circuit of a first one of said plurality of interface circuits and to a second node between said protection circuit and said input circuit of a second one of said plurality of interface circuits;

wherein one of said plurality of pads is a selected pad when said pad is probed, at least one remaining pad is a non-selected pad, one of said plurality of interface circuits corresponding to said selected pad is a selected interface circuit, and at least one remaining interface circuit is a non-selected interface circuit; and testing said internal circuit by using said selected pad, said selected interface circuit, said transfer circuit, and said non-selected interface circuit without using said non-selected pad.

9. The method according to claim 8, wherein said testing comprises:

supplying a test data to said selected pad; testing a portion of said internal circuit associated with said selected interface circuit with said test data through said selected pad and said selected interface circuit; and testing a portion of said internal circuit associated with said non-selected interface circuit with said test data through said selected pad, said selected interface circuit, said transfer circuit, and said non-selected interface circuit corresponding to said non-selected pad.

10. The method according to claim 9, wherein said transfer circuit comprises:

a specific node; and a MOS transistor provided for each of said plurality of interface circuits to connect said specific node and a respective one of said first and second nodes, said testing a portion of said internal circuit associated with said selected pad comprises:

turning off said MOS transistor provided for said selected interface circuit to disconnect said selected interface circuit from said non-selected interface circuit when the portion of said internal circuit associated with said selected interface circuit is tested, and said testing a portion of said internal circuit associated with said non-selected pad comprises:

turning of said MOS transistors provided for said selected interface circuit and said non-selected interface circuit to connect said non-selected interface circuit with said selected interface circuit when the portion of said internal circuit associated with said non-selected interface circuit is tested.

11. The method according to claim 9, wherein said testing a portion of said internal circuit associated with said selected interface circuit comprises:

sending a test data from said selected pad to said internal circuit through said protection circuit and said input circuit in said selected interface circuit;

receiving a response data corresponding to said test data transferred from said internal circuit to said selected pad through an output circuit in said selected interface circuit; and comparing said test data and said response data.

12. The method according to claim 11, further comprising:

latching said test data outputted from said input circuit in said selected interface circuit to supply said test data to the portion of said internal circuit associated with said selected interface circuit; and latching said response data corresponding to said test data from said interface circuit.

13. The method according to claim 11, wherein said testing a portion of said internal circuit associated with said non-selected interface circuit comprises:

sending from said selected pad to said internal circuit through said protection circuit in said selected interface circuit, said transfer circuit, and said input circuit in said non-selected interface circuit;

receiving said response data transferred from said internal circuit to said selected pad through an output circuit, and a protection circuit in said non-selected interface circuit, said transfer circuit, and said protection circuit in said selected interface circuit; and comparing said test data and said response data.

14. The method according to claim 13, further comprising:

latching said test data outputted from said input circuit in said non-selected interface circuit to supply said test data to the portion of said internal circuit associated with said non-selected interface circuit; and latching said response data corresponding to said test data from said interface circuit.

* * * * *